(12) United States Patent
Borthakur et al.

(10) Patent No.: US 9,818,776 B2
(45) Date of Patent: Nov. 14, 2017

(54) INTEGRATING BOND PAD STRUCTURES WITH LIGHT SHIELDING STRUCTURES ON AN IMAGE SENSOR

(71) Applicant: SEMICONDUCTOR COMPONENTS INDUSTRIES, LLC, Phoenix, AZ (US)

(72) Inventors: Swarnal Borthakur, Boise, ID (US); Marc Sulfridge, Boise, ID (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 44 days.

(21) Appl. No.: 14/681,940

(22) Filed: Apr. 8, 2015

(65) Prior Publication Data

US 2016/0300871 A1    Oct. 13, 2016

(51) Int. Cl.
*H01L 31/0232* (2014.01)
*H01L 31/0216* (2014.01)
*H01L 31/18* (2006.01)
*H01L 31/02* (2006.01)
*H01L 27/14* (2006.01)
(Continued)

(52) U.S. Cl.
CPC ...... *H01L 27/1446* (2013.01); *H01L 27/1463* (2013.01); *H01L 27/14607* (2013.01); *H01L 27/14621* (2013.01); *H01L 27/14623* (2013.01); *H01L 27/14636* (2013.01); *H01L 27/14645* (2013.01); *H01L 27/14685* (2013.01); *H01L 27/14689* (2013.01)

(58) Field of Classification Search
CPC ........... H01L 2924/00; H01L 21/76898; H01L 23/481; H01L 27/1463; H01L 27/14636; H01L 27/1464; H01L 27/14645
See application file for complete search history.

(56) References Cited

U.S. PATENT DOCUMENTS 6,630,736 B1    10/2003  Ignaut
7,294,524 B2    11/2007  Park
(Continued)

OTHER PUBLICATIONS

Borthakur et al., U.S. Appl. No. 14/254,196, filed Apr. 16, 2014.
(Continued)

*Primary Examiner* — Allen Parker
*Assistant Examiner* — Ismail Muse
(74) *Attorney, Agent, or Firm* — Treyz Law Group, P.C.; Joseph F. Guihan (57) ABSTRACT

An imaging system may include an image sensor that may be a backside illuminated (BSI) image sensor. The BSI sensor may be bonded to an inactive silicon substrate or bonded to an active silicon substrate like a digital signal processor (DSP). Through-oxide vias (TOVs) may be formed in the image sensor die. A bond pad region may be formed on a light shielding layer to facilitate coupling the light shield to a ground source or other power sources. Color filter housing structures may be formed over active image sensor pixels on the image sensor die. In-pixel grid structures may be integrated with the color filter housing structures to help reduce crosstalk. The light shielding layer may also be formed over reference image sensor pixels on the image sensor die. The TOVs, the in-pixel grid structures, and the light shielding structures may be formed simultaneously.

17 Claims, 8 Drawing Sheets (51) Int. Cl.
  *H01L 21/30* (2006.01)
  *H01L 21/768* (2006.01)
  *H01L 31/14* (2006.01)
  *H01L 27/144* (2006.01)
  *H01L 27/146* (2006.01)

(56) References Cited

U.S. PATENT DOCUMENTS

| | | | |
|---|---|---|---|
| 8,247,852 B2 | 8/2012 | Tai et al. | |
| 8,344,471 B2 | 1/2013 | Tseng et al. | |
| 8,405,182 B2 | 3/2013 | Chou et al. | |
| 8,431,429 B2 | 4/2013 | Tai et al. | |
| 8,497,536 B2 | 7/2013 | Chen et al. | |
| 8,536,044 B2 | 9/2013 | Li et al. | |
| 8,536,672 B2 | 9/2013 | Chang et al. | |
| 8,569,856 B2 | 10/2013 | Qian et al. | |
| 8,597,074 B2 | 12/2013 | Farnworth et al. | |
| 8,664,736 B2 | 3/2014 | Tsai et al. | |
| 8,680,635 B2 | 3/2014 | Tseng et al. | |
| 8,697,472 B2 | 4/2014 | Weng et al. | |
| 8,736,006 B1 | 5/2014 | Tsai et al. | |
| 8,796,805 B2 | 8/2014 | Ting et al. | |
| 8,803,271 B2 | 8/2014 | Liu et al. | |
| 2005/0140772 A1* | 6/2005 | Kurose | G06K 15/1238 347/237 |
| 2009/0243053 A1* | 10/2009 | Cabral, Jr. | H01L 21/76801 257/660 |
| 2013/0001728 A1 | 1/2013 | Amicis | |
| 2013/0068929 A1 | 3/2013 | Solhusvik et al. | |
| 2013/0070109 A1 | 3/2013 | Gove et al. | |
| 2013/0221470 A1 | 3/2013 | Kinsman et al. | |
| 2013/0323875 A1* | 12/2013 | Park | H01L 31/02240 438/70 |
| 2013/0328151 A1 | 12/2013 | Kao | |
| 2014/0055654 A1 | 2/2014 | Borthakur et al. | |
| 2014/0167197 A1 | 6/2014 | Jangjian et al. | |
| 2014/0199804 A1 | 7/2014 | Tsai et al. | |
| 2014/0263962 A1* | 9/2014 | Ahn | H01L 27/14618 250/208.1 |

OTHER PUBLICATIONS

Borthakur et al., U.S. Appl. No. 14/270,233, filed May 5, 2014.
Borthakur et al., U.S. Appl. No. 14/191,965, filed Feb. 27, 2014.

* cited by examiner

INTEGRATING BOND PAD STRUCTURES WITH LIGHT SHIELDING STRUCTURES ON AN IMAGE SENSOR

BACKGROUND

This relates generally to imaging systems, and more particularly to imaging systems with bond pad structures.

Modern electronic devices such as cellular telephones, cameras, and computers often use digital image sensors. Imaging systems (i.e., image sensors) often include a two-dimensional array of image sensing pixels. Each pixel typically includes a photosensitive element such as a photodiode that receives incident photons (light) and converts the photons into electrical signals. The imaging system contains an image sensor die with an image sensor integrated circuit and an array of photodiodes formed in a semiconductor substrate. Alternatively the imaging system contains an image sensor die having an array of photodiodes formed in a semiconductor substrate and the image sensor die is mounted on a digital signal processor (DSP) die. In both cases the face of the image sensor die is attached to a carrier substrate. In the first case the substrate is a piece of silicon without any circuitry and in the second case the substrate has the circuitry of the DSP. This second case is also known as a stacked sensor. The back side of the image sensor die is then processed through multiple steps including thinning, wet etch, CMP, passivation, light shield, bond pad formation, color-filter-array (CFA) and micro-lens. This type of image sensor is also known as a backside illumination (BSI) image sensor.

A metal light shield is formed on the backside of the BSI sensor to block light to the reference pixels (i.e. the optically black pixels). The metal light shield also blocks stray light from entering the periphery of the die. This same metal light shield can be extended into the pixel area in the form of a grid. This metal light grid reduces the cross-talk between the pixels, and blocks unwanted high angle light from entering the pixels. If the high angle stray light is not mitigated, it can cause "purple flare".

A metal bond pad needs to be formed on the back side of the BSI sensor to connect the circuitry in the BSI sensor to the circuit board or package. This metal bond pad allows the usage of wirebonds or gold stud bumps to connect to the circuit board or the sensor package.

The process of creating the bond pad metal is generally separate from the process of creating the light shield metal or the light grid metal. It is desirable to reduce the number of process steps to reduce the cost of production. The standard methods also create high topography in the form of the bond pad metal thickness that projects up from the wafer surface. This topography can increase resist streaking during subsequent CFA and ulens processing which leads to yield loss.

It would therefore be desirable to provide improved ways of manufacturing image sensor dies.

DETAILED DESCRIPTION

Electronic devices such as digital cameras, computers, cellular telephones, and other electronic devices include image sensors that gather incoming image light to capture an image. The image sensors may include arrays of imaging pixels. The pixels in the image sensors may include photosensitive elements such as photodiodes that convert the incoming image light into image signals. Image sensors may have any number of pixels (e.g., hundreds or thousands or more). A typical image sensor may, for example, have hundreds of thousands or millions of pixels (e.g., megapixels). Image sensors may include control circuitry such as circuitry for operating the imaging pixels and readout circuitry for reading out image signals corresponding to the electric charge generated by the photosensitive elements.

Figure 1:
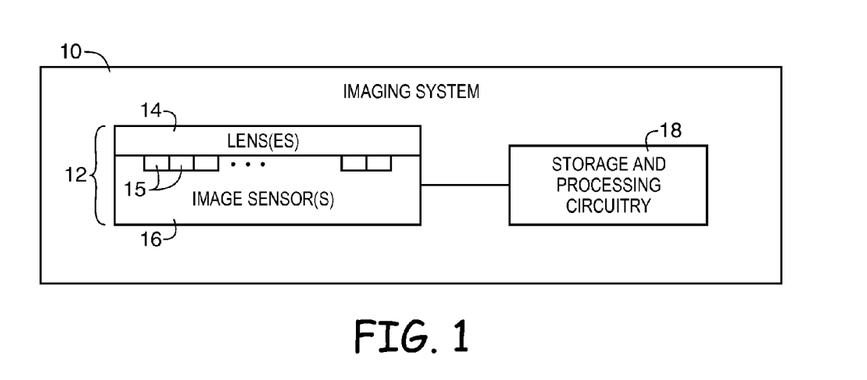
FIG. 1 is a diagram of an illustrative imaging system that may include a camera module having an image sensor in accordance with an embodiment.

FIG. 1 is a diagram of an illustrative electronic device that uses an image sensor to capture images. Electronic device 10 of FIG. 1 may be a portable electronic device such as a camera, a cellular telephone, a video camera, or other imaging device that captures digital image data. Camera module 12 may be used to convert incoming light into digital image data. Camera module 12 may include one or more lenses 14 and one or more corresponding image sensors 16. During image capture operations, light from a scene may be focused onto image sensor 16 using lens 14. Image sensor 16 may provide corresponding digital image data to processing circuitry 18. Image sensor 16 may, for example, be a backside illumination (BSI) image sensor. If desired, camera module 12 may be provided with an array of lenses 14 and an array of corresponding image sensors 16. Image sensor 16 may include an array of image sensor pixels such as an array of image sensor pixels 15 and a corresponding array of color filter elements.

Processing circuitry 18 may include one or more integrated circuits (e.g., image processing circuits, microprocessors, storage devices such as random-access memory and non-volatile memory, etc.) and may be implemented using components that are separate from camera module 12 and/or that form part of camera module 12 (e.g., circuits that form part of an integrated circuit that includes image sensors 16 or an integrated circuit within module 12 that is associated with image sensors 16). Image data that has been captured by camera module 12 may be processed and stored using processing circuitry 18. Processed image data may, if desired, be provided to external equipment (e.g., a computer or other device) using wired and/or wireless communications paths coupled to processing circuitry 18.

Figure 2:
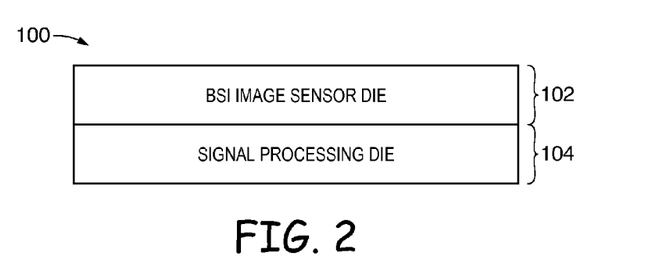
FIG. 2 is a diagram of an illustrative imaging system that includes a backside illuminated (BSI) image sensor die stacked on top of a signal processing die in accordance with an embodiment.

FIG. 2 shows an imaging system 100 that includes an image sensor die 102 stacked on top of a signal processing die 104. Image sensor die 102 may be a backside illuminated (BSI) image sensor (as an example). Configured in this way, image sensor die 102 may include an array of image sensor pixels operable to produce image data (i.e., still or video data). Image data produced by image sensor die 102 may then be fed to signal processing die for further processing. Die 104 may sometimes be referred to as a digital signal processor (DSP). The example of FIG. 2 is merely illustrative. If desired, image sensor die 102 may be a front-side illuminated (FSI) image sensor die or 102 may be a backside illuminated (BSI) image sensor with signal processing capability, while die 104 may be an inactive silicon substrate without any circuitry.

In conventional imaging systems, circuitry within an image sensor die is typically coupled to a bond pad region. With backside illumination, the face of the image sensor wafer is attached to the face of a carrier substrate. This carrier substrate may be inactive or it may contain active circuitry (e.g. DSP). The back side of the image sensor die is then processed through multiple steps which may include thinning, wet etch, CMP, passivation, light shield, bond pad formation, color-filter-array (CFA) and micro-lens. A metal light shield is often formed on the backside of the BSI sensor. This metal light shield can be extended into the pixel area in the form of a grid between the active pixels. When the image sensor wafer is attached to a carrier substrate containing active circuitry, it is often useful to make connections between the image sensor wafer and the carrier substrate circuitry. One way to establish these connections is to form vias through the image sensor silicon and through the inter-metal dielectric layers of the image sensor.

A bond pad can then be formed over the vias in an additional processing step after the via forming steps. This method of forming image sensor dies does not provide satisfactory planarity. The bond pad coupled to vias adds extra height within the die, making the surface topography less than ideal which can lead to yield loss during subsequent CFA and ulens processing. In addition, the bond pad cannot be directly coupled to a light shielding layer, which makes coupling to power sources more difficult. An additional lithography and etch step would be necessary to make the bond pad connection to the light shielding layer. Therefore, forming image sensor structures in this way can be inefficient and costly. An image sensor die in accordance with an embodiment can be formed with significantly improved surface planarization and topography.

Figure 3:
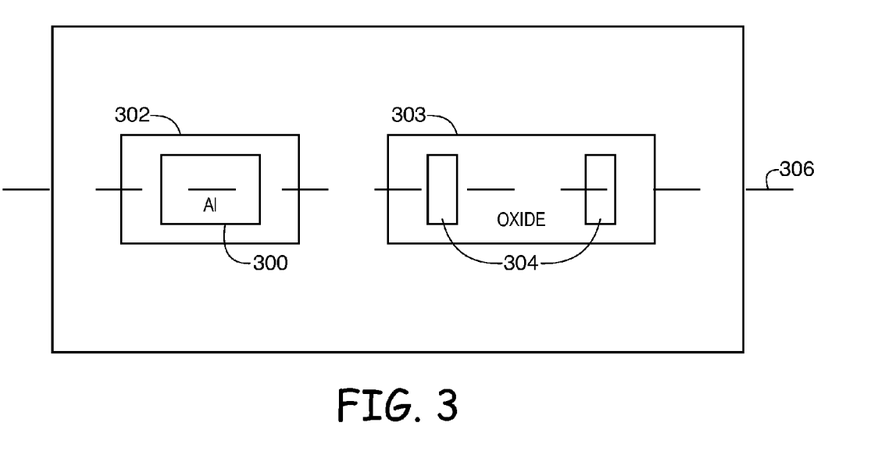
FIG. 3 is a top down view of an aluminum bond pad and associated via structures in accordance with an embodiment.

FIG. 3 is a top down view of an aluminum bond pad 300 surrounded by a dielectric layer 302, in addition to through-oxide vias 304 surrounded by trench lining oxide 303.

Figure 4:
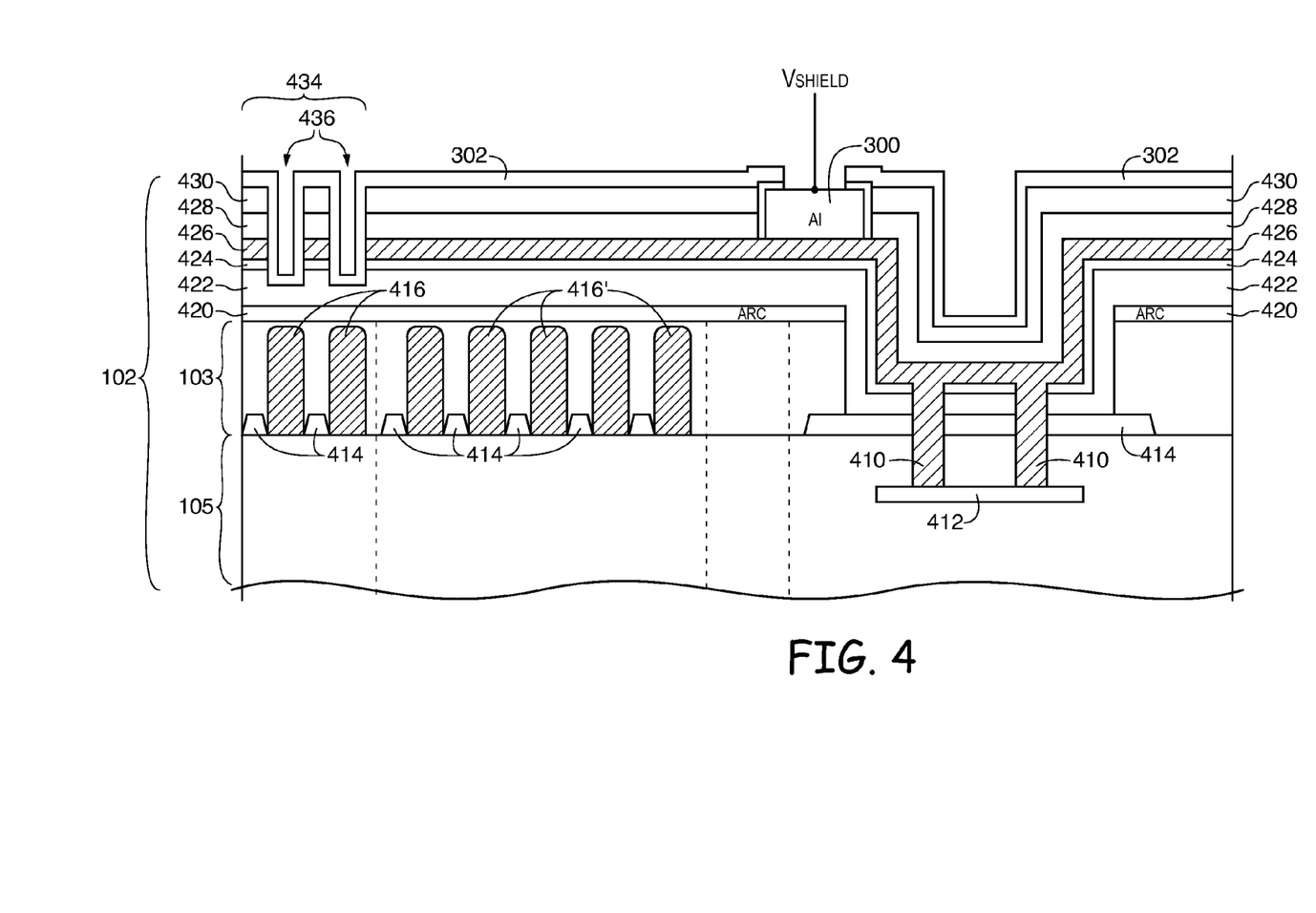
FIG. 4 is a cross-sectional side view of an illustrative imaging system having a light shield structure and a bond pad structure that are grounded through a bond pad region in accordance with an embodiment.

FIG. 4 is a cross-sectional view of image sensor die 102 cut along line 306 of FIG. 3. As shown in FIG. 4, image sensor die 102 may include a substrate 103 having a front surface and a back surface and interconnect routing layer 105 formed on the front surface of the substrate 103. Layer 105 may include alternating metal interconnect routing structures 412 formed over the front side of the substrate 103 coupled to through-oxide via structures 410.

Photosensitive elements such as photodiodes 416 may be formed at the front surface of substrate 103. Photodiodes 416 that are formed in an "active" portion of image sensor 102 may receive incoming light and convert the incoming light into corresponding pixel signals, whereas photodiodes 416' that are formed in a peripheral portion of image sensor 102 may not receive any incoming light and may serve as reference photodiodes for noise cancelling purposes (as an example). Shallow trench isolation (STI) structures such as STI structures 414 may be formed on the front surface of the image sensor wafer adjacent to the interconnect routing layer 105 and in between each adjacent pair of photodiodes 416 and 416'. STI structures 414 may serve to ensure that the neighboring photodiodes are electrically isolated from one another.

An antireflective coating (ARC) layer such as ARC layer 420 may be formed at the back surface of substrate 103. ARC layer 420 may serve to ensure that the light entering substrate 103 from the back side is not reflected back towards the direction from which it arrived.

A trench may be etched through the ARC layer 420 and the substrate 103. A first dielectric layer 422 (e.g. a first oxide layer) may be formed over layer 420, and into this trench. A first passivation layer 424 (e.g. a nitride layer) may be formed over layer 422, which can act as an etch stop for subsequent layers.

Vias 410 may be formed in the trench through the dielectric layers 424, 422, ARC layer 420, and the STI structures 414 and may therefore sometimes be referred to herein as through-oxide via structures (410). For example, after the construction of the first passivation layer 424 on the first dielectric layer 422, a first and second hole can be formed simultaneously through layers 424, 422, 420, 414, and through at least a portion of the metal interconnect routing layers 412. Only one hole may suffice in terms of bond pad electrical resistance. An example of multiple holes is shown in FIG. 4, however if desired, there may be one hole, two holes, or three or more holes.

Conductive material (e.g. tungsten, tungsten nitride, titanium, titanium nitride, tantalum, tantalum nitride a combination of these materials, or other suitable conducting material) can then be deposited into the holes to form TOV structures 410. Depending on the size of these holes the conductive material may only coat the TOV sidewall and may not fill the entire TOV hole. Conductive through-oxide via structures 410 may serve to couple metal interconnect routing structures 412 to ground. At the same time, a light shielding layer 426 may be formed from the same opaque, conductive material as TOV structures 410 (e.g. 410 and 426 may be formed simultaneously). Light shield 426 may be used as an in-pixel light grid above the active pixel region to mitigate high-angle stray light, as well as a light blocking layer over reference pixels used for calibration. The in-pixel light grid may also be referred to as an in-pixel matrix. As an alternative to being biased to ground, layers 410 and 426 may instead be connected to a different reference voltage, such that these structures can be biased to any suitable potential.

At this stage, the light shielding layer 426 may be etched to form the bond pad area and the light shield area. However, the in-pixel grid, which also includes light shield 426, may not be etched at this time.

Still referring to FIG. 4, a second dielectric layer 428 (e.g. a second oxide layer or color filter array-in-a-box (CIAB) oxide layer) may be formed over light shield layer 424. A bond pad 300 may be deposited on the light shield layer 426 which was already etched to form a bond pad region into a portion of the second dielectric layer 428. The bond pad will be formed directly on the light shielding layer without any intervening via structure. A second passivation layer 430 (e.g. an etch stop layer) may be formed to surround the bond pad and at the same time be formed over the second dielectric layer 428 (e.g. layer 430 may be formed and fill the regions between the second dielectric layer 428 and the bond pad 300 simultaneously).

Color filter housing structures 434 may be formed in the active portion of the image sensor die 102. Color filter housing structures 434 may include an array of slots 436 in which color filter elements may be inserted. An array of color filter elements are sometimes referred to as CFA-in-a-box (abbreviated as "CIAB"). Color filter array housing structures 434 may have walls that are formed from the dielectric material in layer 428 and may serve to provide improved light guiding capabilities for directing light to desired image sensor pixels.

The CIAB wall structures such as CIAB wall structures 434 may be etched through layers 430, 428, 426, 424, and a portion of 422 above the corresponding regions between photodiodes 416, and may simultaneously create an array of slots 436 above the region corresponding to photodiodes 416. A third dielectric layer 302 (e.g. a CIAB sidewall oxide) is formed over the second passivation layer 430. Etch stop layer 430 may be thicker than the CIAB sidewall oxide 302. A portion of layers 430 and 302 are etched to expose the top portion of the bond pad region 300. The bond pad region 300 may then be shorted to ground.

The light shielding structure over the reference photodiodes and the in-pixel light grid in the active pixel region may be grounded or coupled to other power supply voltages. Not every bond pad region and associated via structures need to be grounded, however. The bond pad and via structures may be coupled to other signals. For example, another bond pad region may be used to receive a user control signal input, a positive power supply signal, or can even be used to transfer captured image signals or other types of data.

Figure 5:
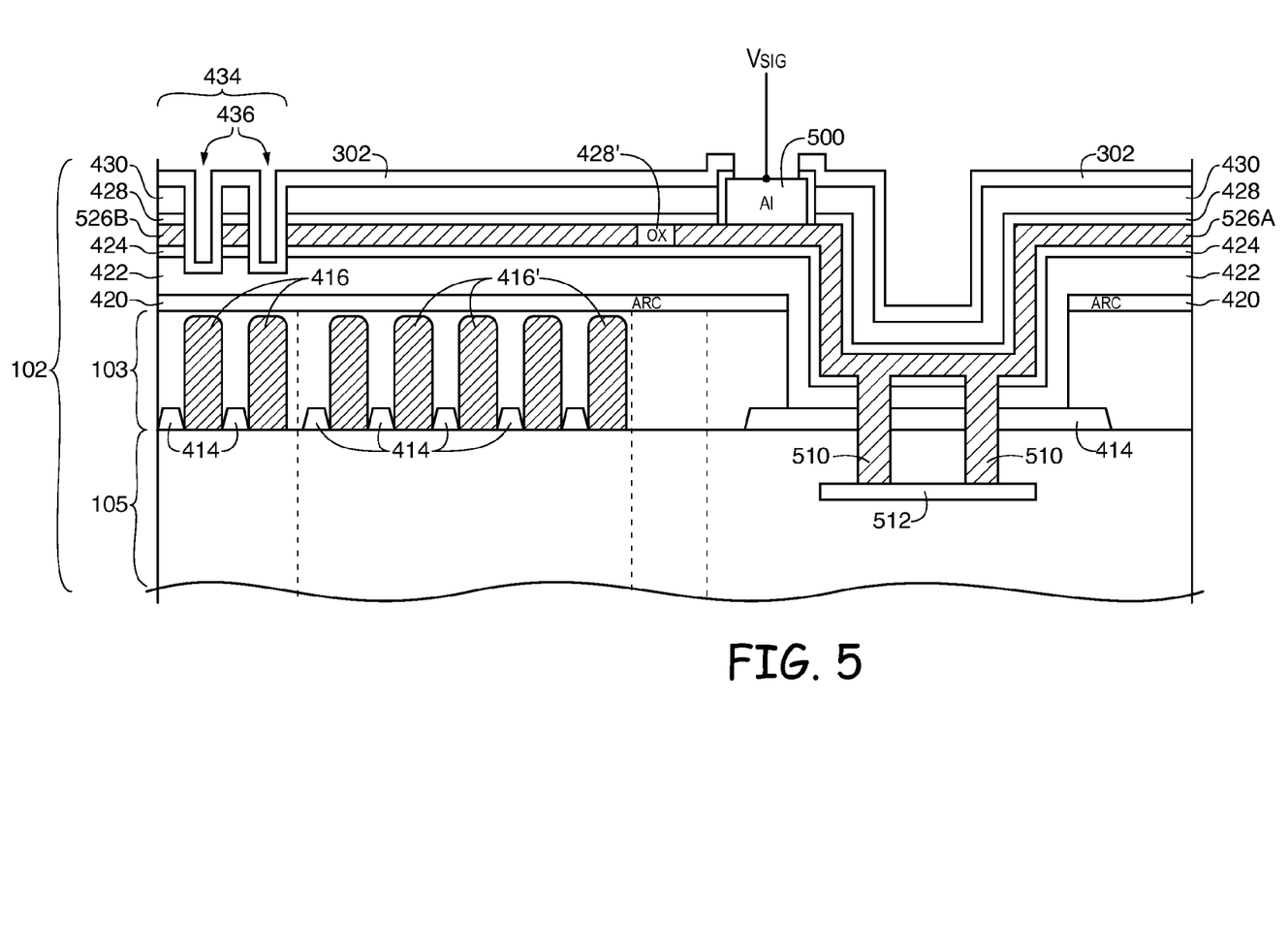
FIG. 5 is a cross-sectional view of an illustrative imaging system having a bond pad structure and a light shield structure that are coupled to non-grounding signal through a bond pad region in accordance with an embodiment.

FIG. 5 shows another cross-sectional view of image sensor die 102 with bond pad 500, vias 510, and light shielding layer 526A being electrically isolated from light shielding structure 526B. TOVs 510 couple metal interconnect routing layers 512 to the light shielding layer 526A. Unlike FIG. 4, the light shielding layer has an etched portion left of the bond pad region 500 and is filled with a dielectric layer (e.g. oxide) 428'. This layer may be similar to oxide layer 428 since oxide 428 may be deposited after this etched portion of 526A/B is formed. This portion may serve to discontinue the connection from the grounded light shield layer 526B to the aluminum bond pad 300. The aluminum bond pad 300, light shield layer 526A, and subsequently the TOVs 510 and metal interconnect routing structures 512 may then be coupled to another signal voltage (e.g. $V_{SIG}$).

Figure 6:
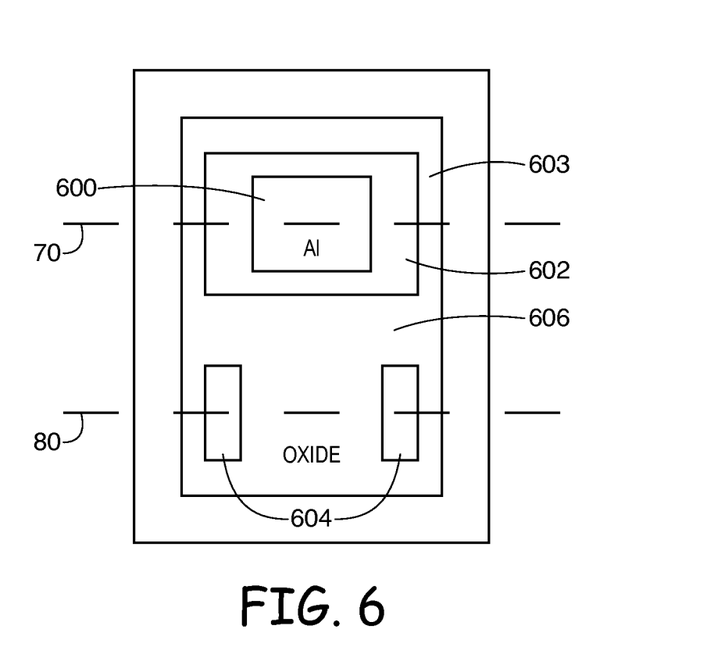
FIG. 6 is a top down view of an aluminum bond pad and associated via structures that are formed within a trench in accordance with another embodiment.

In accordance with another suitable embodiment, the bond pad structure may be formed within the trench in which the through-oxide vias are formed. FIG. 6 is a top down view of an aluminum bond pad 600 surrounded by a dielectric layer 602, in addition to through-oxide vias 604 surrounded by trench lining oxide 606.

Figure 7:
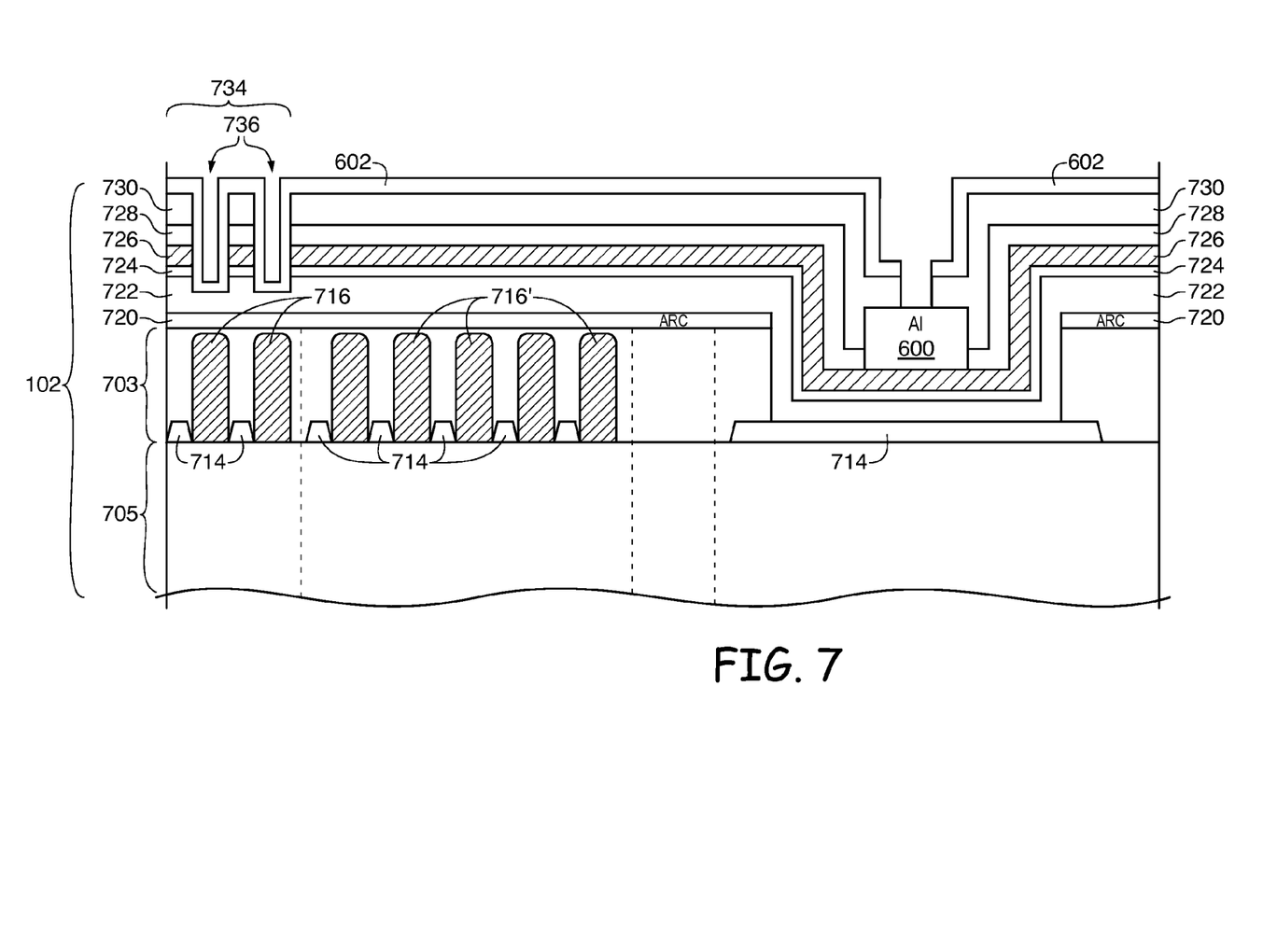
FIG. 7 is a cross-sectional side view showing how the aluminum bond pad of FIG. 6 is formed within the trench in accordance with another embodiment.

FIG. 7 shows a cross-sectional side view of the image sensor of FIG. 6 cut along line 70. Bond pad 600 is shown in this cross-section formed on a light shielding layer 726 without any intervening vias. This cross-sectional view may include some or all of the features of FIG. 4 described above. Image sensor die 102 may include a substrate 703 having a front surface and a back surface and interconnect routing layer 105 formed on the front surface of the substrate 703. Layer 105 may include alternating metal interconnect routing structures 714 formed over the front side of the substrate 703.

Photosensitive elements such as photodiodes 716 may be formed at the front surface of substrate 703. Photodiodes 716 that are formed in an "active" portion of image sensor 102 may receive incoming light and convert the incoming light into corresponding pixel signals, whereas photodiodes 716' that are formed in a peripheral portion of image sensor 102 may not receive any incoming light and may serve as reference photodiodes for noise cancelling purposes (as an example). Shallow trench isolation (STI) structures such as STI structures 714 may be formed on the front surface of the image sensor wafer adjacent to the interconnect routing layer 105 and in between each adjacent pair of photodiodes 716 and 716'. STI structures 714 may serve to ensure that the neighboring photodiodes are electrically isolated from one another.

An antireflective coating (ARC) layer such as ARC layer 720 may be formed at the back surface of substrate 103. A first dielectric layer 722 (e.g. a first oxide layer) may be formed over layer 720. A trench may then be etched on the back side of interconnect routing layer 105, directly above the metal interconnect routing structures 712. The trench area may then be filled with more dielectric material (e.g. oxide material). A first passivation layer 724 may be formed on the first dielectric layer 722. A light shielding layer 726, which may at least be partially formed in the trench, may then be formed on the first passivation layer 724. At this stage the Layer 726 may be etched to form the bond pad area and the light shield area. However, the in-pixel grid, which may also be formed from the same material as the light shield 726, is not etched. A second dielectric layer 728 may be formed on the light shielding layer 726. A portion of this layer may be etched to allow the construction of bond pad 600 that contacts the light shield layer 726. After the construction of bond pad 600, a second passivation layer 730 (e.g. an etch stop layer) may be formed to surround the bond pad and at the same time be formed over the second dielectric layer 728 (e.g. layer 730 may be formed and fill the regions or coat the sidewall between the second dielectric layer 728 and the bond pad 600 simultaneously). The light shielding layer 726 may be used as an in-pixel light grid above the active pixel region to mitigate high-angle stray light. The in-pixel light grid may also be referred to as an in-pixel matrix.

Color filter housing structures 734 may be formed in the active portion of the image sensor die 102. Color filter housing structures 734 may include an array of slots 736 in which color filter elements may be inserted. Color filter array housing structures 734 may have walls that are formed from the dielectric material in layer 728 and may serve to provide improved light guiding capabilities for directing light to desired image sensor pixels.

The CIAB wall structures such as CIAB wall structures 734 may be etched through layers 730, 728, 726, 724, and a portion of 722 above the corresponding regions between photodiodes 716, and may simultaneously create an array of slots 736 above the region corresponding to photodiodes 716. A third dielectric layer 602 (e.g. a CIAB sidewall oxide) is formed over the second passivation layer 730. A portion of layers 730 and 602 are etched to expose the top portion of the bond pad region 600.

Figure 8:
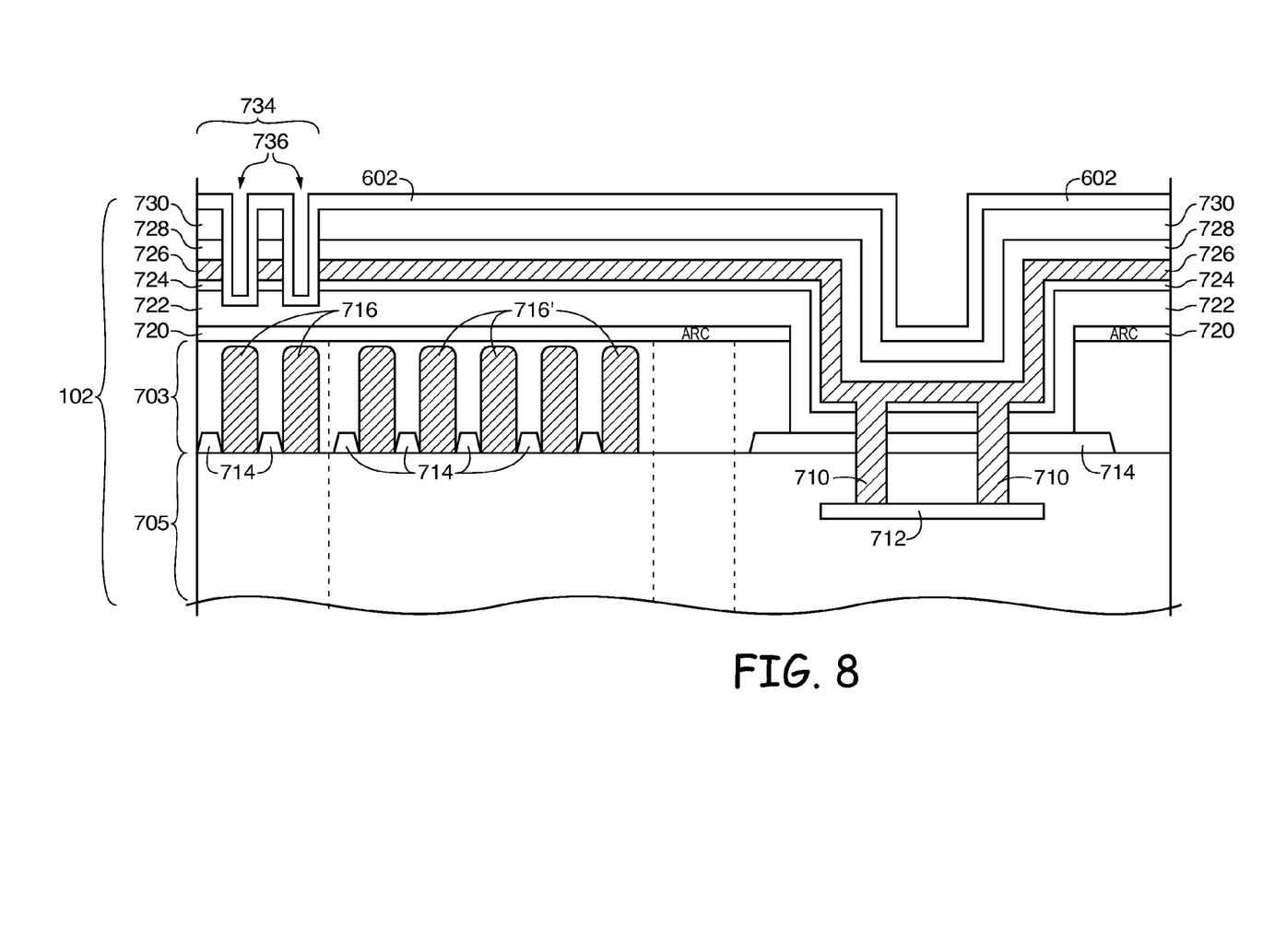
FIG. 8 is a cross-sectional side view showing how the via structures of FIG. 6 are formed within the trench in accordance with an embodiment.

FIG. 8 shows a cross-sectional side view of the image sensor of FIG. 6 cut along line 80. In this cross-sectional view, the through-oxide vias (or TOVs) 710 are shown.

Though the bond pad is not shown in this cross-sectional view, it can be seen in the cross-section of FIG. 7.

Image sensor die 102 may include a substrate 703 having a front surface and a back surface and interconnect routing layer 105 formed on the front surface of the substrate 703. Layer 705 may include alternating metal interconnect routing structures 712 formed over the front side of the substrate 703 coupled to through-oxide via structures 710.

Figure 9:
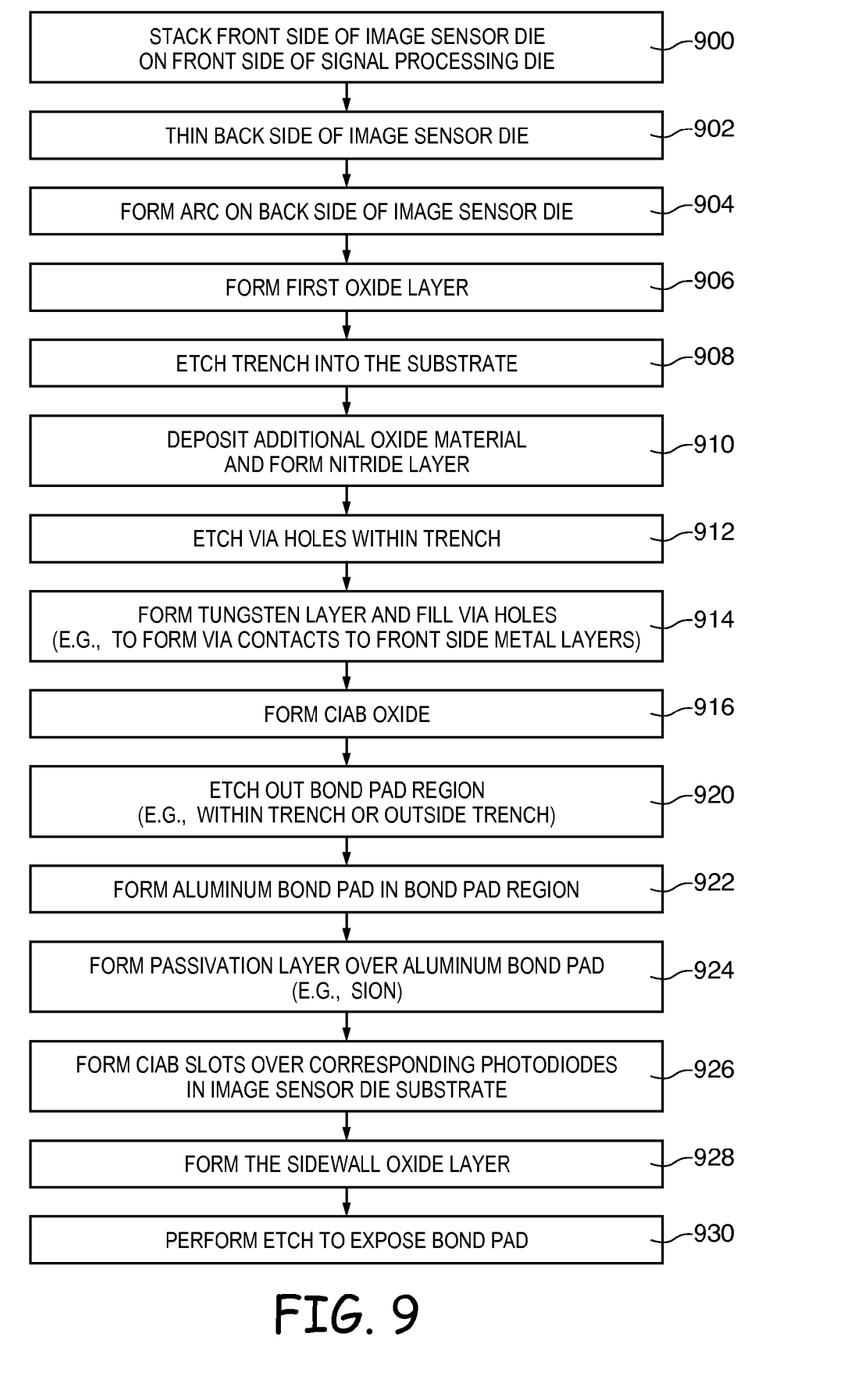
FIG. 9 is a flow chart of illustrative steps involved in forming an imaging system with a bond pad region formed within a trench, through-oxide vias, and a light shield in accordance with an embodiment.

FIG. 9 is a flow chart of illustrative steps for manufacturing an imaging system. At step 900 the front side of the image sensor die 102 may be bonded directly to the front side of a carrier wafer if it is a BSI image sensor only, or it may be bonded directly on the front side of signal processing die 104 if it is a stacked BSI image sensor. The front side of each die may generally refer to the side at which interconnect routing layers are formed.

At step 902 the back side of the substrate (103 in FIG. 4-5 or 703 in FIGS. 7-8) of image sensor 102 may be thinned down to help reduce stack height. Prior to this step, photodiodes (416 or 716), shallow trench isolation structures (414 or 714), other pixel circuitry, and associated routing circuitry may have already been formed.

At step 904, ARC liner 420 or 720 may be formed on the back side of substrate (103 in FIG. 4-5 or 703 in FIGS. 7-8). At step 906, a first dielectric layer (e.g. a first oxide layer 422 or 722) may be formed on the corresponding ARC liner. At step 908, a portion of the substrate is etched to create a trench. Additional oxide material is deposited and a first passivation layer (e.g. a first nitride liner 424 or 724) may be formed on the first oxide layer at step 910.

At step 912, holes for through-oxide vias are etched into the trench. At step 914, the via holes are filled or lined with opaque, conductive material (e.g. tungsten) and at the same time a light shield layer (424 or 724) is formed using the same conducive material. At least a portion of the opaque, light shielding layer may partially be formed in the trench. The vias may, for example, may form via contacts to front side metal layers (412, 512, or 712). At step 916, a second dielectric layer (e.g. CIAB oxide layers 428 or 728) may be formed.

At step 920 a bond pad region is etched in a portion of the CIAB oxide. The bond pad region can either be etched within the trench or outside of the trench (e.g. to one side of the trench on the light shielding layer). A bond pad (e.g. aluminum) may subsequently be formed in the bond pad region at step 922. At step 924, a second passivation layer (e.g. SiON 430 or 730) may be formed over the aluminum bond pad (300 in FIG. 4, 500 in FIG. 5, or 600 in FIG. 7). At step 926 CIAB slots (436 or 736) may be formed over corresponding photodiodes (416 or 716) in the image sensor die substrate. A third dielectric layer (e.g. sidewall oxide liner 302 or 602) may be formed at step 928. At step 930 a portion of the second passivation layer and the sidewall oxide layer may be etched to expose a portion of the bond pad.

Figure 10:
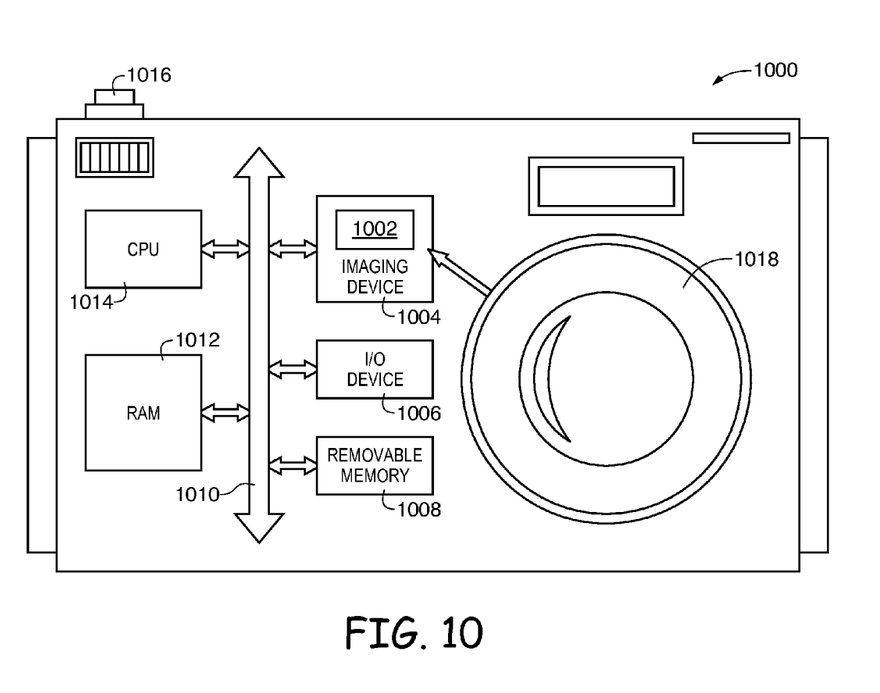
FIG. 10 is a block diagram of a system employing at least some of the embodiments of FIGS. 1-9 in accordance with an embodiment.

FIG. 10 shows in simplified form a typical processor system 1000, such as a digital camera, which includes an imaging device 1004. Imaging device 1004 may include a pixel array 1002 having pixels of the type shown in FIG. 1 (e.g., pixel array 1002 may be an array of image pixels formed on an image sensor SOC). Processor system 1000 is exemplary of a system having digital circuits that may include imaging device 1004. Without being limiting, such a system may include a computer system, still or video camera system, scanner, machine vision, vehicle navigation, video phone, surveillance system, auto focus system, star tracker system, motion detection system, image stabilization system, and other systems employing an imaging device.

Processor system 1000, which may be a digital still or video camera system, may include a lens such as lens 1018 for focusing an image onto a pixel array when shutter release button 1016 is pressed. Processor system 1000 may include a central processing unit such as central processing unit (CPU) 1014. CPU 1014 may be a microprocessor that controls camera functions and one or more image flow functions and communicates with one or more input/output (I/O) devices 1006 over a bus such as bus 1010. Imaging device 1004 may also communicate with CPU 1014 over bus 1010. System 1000 may include random access memory (RAM) 1012 and removable memory 1008. Removable memory 1008 may include flash memory that communicates with CPU 1014 over bus 1010. Imaging device 1004 may be combined with CPU 1014, with or without memory storage, on a single integrated circuit or on a different chip. Although bus 1010 is illustrated as a single bus, it may be one or more buses or bridges or other communication paths used to interconnect the system components.

Various embodiments have been described illustrating an electronic device (see, e.g., device 10 of FIG. 1) that includes an imaging system and host subsystems. An imaging system may include one or more image sensors. Each image sensor may include an array of image pixels formed on a semiconductor substrate. Each image pixel may include one or more photosensitive elements configured to convert incoming light into electric charges.

In particular, imaging circuitry may include an image sensor die stacked on top of a digital signal processor (DSP) die. The image sensor die may include a substrate having front and back surfaces, a plurality of imaging pixels, photosensitive elements, shallow trench isolation (STI) structures formed in the front surface of the substrate, and interconnect routing layers formed on the front surface of the substrate, color filter containment structures, an opaque light shielding layer (e.g. tungsten), and a layer of antireflective coating (ARC) material formed on the back surface of the substrate, a first dielectric layer formed on the ARC layer, a first passivation layer formed on the first dielectric layer, a second dielectric layer formed on the first passivation layer, a second passivation layer formed on the second dielectric layer, and a third dielectric layer formed on the second passivation layer. The first, second, and third dielectric layers may be formed from oxide, whereas the first and second passivation layers may be formed from nitride or other suitable materials (as examples).

The first dielectric layer formed on the back side of the substrate may form wall portion for the color filter containment structures (sometimes referred to as CFA-in-a-box structures), in addition to a bond pad (e.g. aluminum) being formed in at least this layer. The bond pad may be formed directly on the conductive light shielding layer without any intervening conductive via structures. The bond pad may be shorted to ground, which can also serve to short the light shielding layer to ground. Consequently, shorting to ground may supply power to an in-pixel light grid structure.

The substrate may also have metal interconnect routing structures formed on its front side. A trench may be formed in the substrate, and can subsequently have a portion of the light shield extending through it. Conductive vias may be formed within the trench, and can extend from the portion of the light shield. These vias may be coupled to the metal interconnect routing structures. The vias and the light shielding layer may be formed from the same opaque, conductive material simultaneously. In one suitable arrangement, the aluminum bond pad may be formed within the same trench without any intervening via structures.

The foregoing is merely illustrative of the principles of this invention and various modifications can be made by those skilled in the art without departing from the scope and spirit of the invention. The foregoing embodiments may be implemented individually or in any combination.

Although the invention has been described in some detail for the purposes of clarity, it will be apparent that certain changes and modifications can be practiced within the scope of the appended claims. Although some of the appended claims are single dependent only or reference only some of their preceding claims, their respective feature(s) can be combined with the feature(s) of any other claim.

What is claimed is:

1. An image sensor, comprising:
   a substrate having a front side and a back side;
   photosensitive elements formed in the front side of the substrate;
   color filter elements formed over the back side of the substrate;
   a dielectric layer that is formed over the back side of the substrate, wherein the color filter elements are formed at least partially in the dielectric layer;
   a bond pad formed in at least the dielectric layer;
   a light shielding structure, wherein a first portion of the light shielding structure is formed over the back side of the substrate and wherein the first portion of the light shielding structure covers a plurality of the photosensitive elements;
   a trench in the substrate, wherein the light shielding structure has a second portion that extends into the trench, and wherein the first and second portions of the light shielding structure are electrically connected;
   metal interconnect routing structures formed over the front side of the substrate;
   shallow trench isolation structures interposed between the second portion of the light shielding structure and the metal interconnect routing structures;
   an oxide layer formed separately from the shallow trench isolation structures and interposed between the second portion of the light shielding structure and the metal interconnect routing structures; and
   a conductive via that extends from the second portion of the light shielding structure to the metal interconnect routing structures through the shallow trench isolation structures and the oxide layer, wherein the conductive via and the light shielding structure are formed from the same conductive material.

2. The image sensor defined in claim 1 wherein the bond pad is formed directly on the light shielding structure.

3. The image sensor defined in claim 1, further comprising:
   color filter containment structures formed over the back side of the substrate, wherein the dielectric layer forms wall portions for the color filter containment structures.

4. The image sensor defined in claim 1, wherein the bond pad is formed on the light shielding structure without any intervening via structure.

5. The image sensor defined in claim 1, wherein the bond pad comprises an aluminum bond pad, and wherein the light shielding structure comprises a tungsten light shield.

6. The image sensor defined in claim 1, wherein the bond pad is configured to receive a power supply voltage.

7. The image sensor defined in claim 6, wherein the first portion of the light shield structure at least partially serves as an in-pixel light grid structure and wherein at least some of the photosensitive elements receive light through openings in the in-pixel light grid structure.

8. The image sensor defined in claim 1, wherein the first portion of the light shielding structure is positioned in a first plane, wherein the second portion of the light shielding structure has a planar portion that is parallel to the first portion and positioned in a second plane, wherein the bond pad is formed in direct contact with the first portion of the light shielding structure, and wherein the conductive via extends from the second portion of the light shielding structure away from the first portion of the light shielding structure towards the metal interconnect routing structures.

9. The image sensor defined in claim 8, wherein the metal interconnect routing structures comprise a planar portion positioned in a third plane, and wherein the conductive via couples the second portion of the light shielding structure to the planar portion of the metal interconnect routing structures.

10. The image sensor defined in claim 1, wherein the oxide layer is in direct contact with the shallow trench isolation structures.

11. The image sensor defined in claim 1, wherein the shallow trench isolation structures are interposed between the oxide layer and the metal interconnect routing structures.

12. The image sensor defined in claim 11, wherein the oxide layer is in direct contact with the shallow trench isolation structures.

13. The image sensor defined in claim 12, further comprising a passivation layer interposed between the oxide layer and the second portion of the light shielding structure.

14. The image sensor defined in claim 13, wherein the shallow trench isolation structures are formed in the front side of the substrate.

15. An image sensor, comprising:
   a substrate having a front side and a back side;
   photosensitive elements formed in the substrate;
   color filter elements formed over the back side of the substrate;
   a dielectric layer that is formed over the back side of the substrate;
   a bond pad;
   a light shielding structure, wherein a first portion of the light shielding structure is formed over the back side of the substrate and wherein the first portion of the light shielding structure covers a plurality of the photosensitive elements; and
   a trench in the substrate, wherein the light shielding structure has a second portion that extends into the trench, wherein the bond pad is electrically connected to the second portion of the light shielding structure, wherein the bond pad is formed in the trench, wherein the first portion of the light shielding structure is positioned in a first plane, wherein the second portion of the light shielding structure has a planar portion that is parallel to the first portion and positioned in a second plane, wherein the bond pad is formed in direct contact with the planar portion of the second portion of the light shielding structure, and wherein no portion of the bond pad extends above the first plane.

16. An image sensor, comprising:
   a substrate having a front side and a back side;
   photosensitive elements formed in the front side of the substrate;
   color filter elements formed over the back side of the substrate;

a dielectric layer that is formed over the back side of the substrate, wherein the color filter elements are formed at least partially in the dielectric layer;

a bond pad formed in at least the dielectric layer;

a light shielding structure, wherein a first portion of the light shielding structure is formed over the back side of the substrate and wherein the first portion of the light shielding structure covers a plurality of the photosensitive elements; and a trench in the substrate, wherein the light shielding structure has a second portion that extends into the trench, wherein the bond pad is electrically connected to the second portion of the light shielding structure, wherein the bond pad is formed in the trench, wherein the first portion of the light shielding structure is positioned in a first plane, wherein the second portion of the light shielding structure has a planar portion that is parallel to the first portion and positioned in a second plane, wherein the bond pad is formed in direct contact with the planar portion of the second portion of the light shielding structure, and wherein no portion of the bond pad extends above the first plane.

17. The image sensor defined in claim 16, wherein the first and second portions of the light shielding structure are electrically connected.

\* \* \* \* \*